United States Patent [19]

Tanaka et al.

[11] Patent Number: 5,360,786
[45] Date of Patent: Nov. 1, 1994

[54] SUPERCONDUCTIVE MATERIAL

[75] Inventors: Shoji Tanaka; Koichi Kitazawa; Shin-ichi Uchida; Hidenoir Takagi, all of Tokyo, Japan

[73] Assignee: University of Tokyo, Tokyo, Japan

[21] Appl. No.: 100,139

[22] Filed: Aug. 2, 1993

Related U.S. Application Data

[63] Continuation of Ser. No. 754,199, Aug. 28, 1991, abandoned, which is a continuation of Ser. No. 368,893, Jun. 21, 1989, abandoned, which is a continuation of Ser. No. 143,883, Jan. 14, 1988, abandoned.

[30] Foreign Application Priority Data

Jan. 17, 1987 [JP] Japan ................... 62-7413

[51] Int. Cl.$^5$ .............. H01B 1/00; H01L 39/12
[52] U.S. Cl. .................. 505/125; 505/775; 505/776; 505/777; 505/778; 505/230; 505/150; 252/518; 252/521
[58] Field of Search ............... 252/518, 521; 505/775, 505/776, 777, 778, 1

[56] References Cited

FOREIGN PATENT DOCUMENTS 2-502903 9/1990 Japan.
WO8805029 7/1988 WIPO.

OTHER PUBLICATIONS

Clarke, D. R. *Advanced Ceramic Materials* Special Supp. vol. 2 #3B Jul. 1987 pp. 273-292.
Raveau et al American Chemical Society Symposium Series: High Temperature Superconductivity. New Orleans, Sep. 1987.
Michel et al "Introduction of Bismuth into the High $T_c$ Superconductor $La_{2-x} Sr_xCuO_{4-y}$." 1987.
Rao et al *Current Science* vol. 56 pp. 47-49 Jan. 20, 1987.
Ganguly et al *Proc. Indian Acad. Sci (Chem Sci)* vol. 97 Nos. 5 & 6, pp. 631-633 dated Dec. 1986 published after Jan. 17, 1987.
Bednorz, J. G. et al *Z. Phys. B.-Condensed Matter* vol. 64 pp. 189-193 1986.
Ganguly et al Inspec Abs. No. 87:2953739 of *Proc. Indian Acad. Sci. Chem. Sci.* Dec. 1986 vol. 97.
Capone, D. et al *Appl. Phys. Lett.* vol. 50 No. 9 Mar. 1987 pp. 543-544.
Chu, C. et al *Phys. Rev. Letters* vol. 58, No. 4 Jan. 1987 pp 405-407.
Kishio et al *Chemistry Letters,* The Chemical Society of Japan 1987 pp. 429-432.
Shaplygin, I. S. et al *Russian Journal of Inorganic Chemistry* vol. 24 No. 6, 1979 pp. 820-824.
Nguyen, N. et al *Journal of Solid State Chemistry,* vol. 39 pp. 120-127 1981.
Nguyen, N. et al *J. Phys. Chem. Solids,* vol. 44 No. 5 pp. 389-400, 1983.
Michel, C. etal *Revue de Chimie minerale* tome 21 pp. 407-425 1984.
Uchida et al *Japanese Journal of Applied Physics,* vol. 26 No. 2 Feb. 1987 pp. 6151-6152.
Takagi et al *Japanese Journal of Applied Physics, vol. 26 No. 3 Mar. 1987 pp. L218-L219.*

Primary Examiner—Paul Lieberman
Assistant Examiner—M. Kopec
Attorney, Agent, or Firm—Sughrue, Mion, Zinn, Macpeak & Seas

[57] ABSTRACT

The disclosed superconductive material has a characteristic in accordance with which electrical resistance disappears at a temperature of at least more than the boiling point of 20.3° K. (−252.7° C.) of liquid hydrogen and relates to La-Ba-Cu-O series superconductive material.

Said superconductive material consists essentially of a composition having the formula $$(La_{1-x}M_x)_2CuO_{4-x/2}$$

wherein, M=Ba or Ba(Sr, Ca) and x=0.04~0.20 as a main body, wherein the material has a $K_2NiF_4$ crystal structure.

6 Claims, 8 Drawing Sheets $K_2NiF_4$-Type

FIG_1

○ La, Ba
● Cu

K₂NiF₄ - Type

SUPERCONDUCTIVE MATERIAL

This is a continuation of application No. 07/754,199 filed Aug. 28, 1991, abandoned, which is a continuation of application Ser. No. 07/368,893 filed Jun. 21, 1989, abandoned, which is a continuation of application Ser. No. 07/143,883 filed Jan. 14, 1988, abandoned.

BACKGROUND OF THE INVENTION (a) Field of the Invention

The present invention relates to a superconductive material with an electrical resistance that disappears at a low temperature temperature of which is more than the boiling point of 20.3° K. (−252.7° C.) of liquid hydrogen. More specifically, the present invention relates to La-Ba-Cu-O series superconductive material.

(b) Description of the Related Art

Hitherto known superconductors cannot avoid cooling by cryogenic liquid helium (boiling point: 4.2° K.), and the vast popularization has therefore been prevented by the expensive cooling cost and the uneven distribution of helium in resources.

A confirmed superconductive material having the highest critical temperature is $Nb_3Ga$. Its critical temperature $T_c$ (i.e. transition starting temperature) is 23.6° K., and the material cannot reach a usable level under cooling of liquid hydrogen (i.e. boiling point: 20.3° K.) or liquid neon (i.e. boiling point: 27.1° K.).

In general, in order to confirm a certain material as superconductive, it is necessary to certify that (1) the material structure is definite, (2) the material has a stability for superconductivity and the test result is reproducible, (3) an electrical resistance is rapidly lowered from a certain temperature (i.e. superconductivity transition starting temperature) together with the temperature drop within a range of several degrees, and (4) the material shows the Meissner effect (i.e. complete diamagnetism) characteristic of a superconductive phenomenon.

Thereto, no material satisfying any one of the above conditions can be found, and there has not been developed any practically usable superconductive material at a temperature higher than the boiling point of liquid hydrogen.

SUMMARY OF THE INVENTION

The invention aims to provide practically usable superconductive material showing the superconductivity by electrical resistance disappearing at a temperature of more than the above-described well-known superconductive material (e.g., $Nb_3Ge$), for example, at the temperature of the boiling point of liquid hydrogen (20.3° K.) or liquid neon (27.1° K.).

The present inventors have strenuously studied and clarified the superconductive material actually having superconductivity among the hitherto synthesized lanthanum-barium-copper-oxygen series oxides such as a mixed body of oxides having each kind of crystal structure, further confirmed the structure thereof, and found a superconductive material wherein the transition starting temperature is 30° K., which is more than 25° K. where electrical resistance disappears and it is practically usable at a temperature of liquid hydrogen. Thus, the inventors have attained the present invention.

The present invention provides a superconductive material with as a main body of a composition having the formula

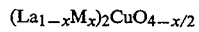

$(La_{1-x}M_x)_2CuO_{4-x/2}$ wherein M represents Ba and X is a numerical value of 0.04~0.20, preferably 0.05~0.15, and having a $K_2NiF_4$ type crystal structure, and showing superconductivity by disappearing electrical resistance under cooling at a temperature of more than the boiling point of 20.3° K. of liquid hydrogen. In the superconductive material according to the invention, when x in the above formula is less than 0.04, the superconductivity of the material obtained disappears, and when x is more than 0.20, the superconductivity is unfavorably deteriorated.

Almost all copper exists in the bivalent condition, and as a result that La is trivalent and M is bivalent, a theoretical mol ratio of oxygen to copper becomes 4-X/2, but there is a case that a part of copper becomes trivalent according to a sintering temperature or atmosphere at the time of crystallizing said composition, and in such a case, the total mol ratio of oxygen to copper is slightly higher than 4-X/2, but the present invention does not exclude such a case. That is, it is preferable to occupy almost all portions by the composition of $(La_{1-x}M_x)_2CuO_{4-x/2}$.

Even if high temperature sintering is carried out under an oxygen atmosphere, formation of trivalent copper is not so large, but usually less than 10%.

Further, a part of M may preferably contain any component other than barium (Ba), such as that substituted by strontium (Sr) or calcium (Ca).

A "main body" mentioned in the present invention means that the condition is occupied almost all portion by said composition, and the crystal structure is substantially the same and no bad influence is given to achievement of the object of the invention, any metal other than said composition, such as strontium (Sr) or calcium (Ca) can be coexistent. A blending ratio enabling to substitute for barium (Ba) is up to 50% for strontium (Sr) and up to 30% for calcium (Ca).

BRIEF DESCRIPTION OF THE DRAWINGS

For a better understanding of the invention, reference is made to the accompanying drawings, in which.

DESCRIPTION OF THE PREFERRED EMBODIMENT

The superconductive material consisting of a composition of said formula as a main body and having a $K_2NiF_4$ type crystal structure starts superconductive transition at a temperature (at least more than 20° K.)

higher than that of the hitherto known superconductive material.

The invention will be explained by referring to examples in detail, but the invention is not limited to these examples.

EXAMPLE 1

In said formula, X is 0.075; a lanthanum-barium-copper-oxygen composition was prepared.

The calculated amounts of each powder of special grade reagent of $La_2O_3$, $BaCO_3$ and $CuO$ were mixed in an agate mortar, reacted at 1,100° C. in a crucible and further reacted in the air for 10 hours, and ground, and further reacted in the air atmosphere at 1,100° C. for 10 hours.

Thereafter, the mixed powder was ground again, pressed with a pressure of about 1,000 kg/cm$^2$ to make pellets, and sintered in a furnace at a temperature of 1,000° C. for 5 hours.

It was confirmed by X-ray diffraction that each sintered material had a $K_2NiF_4$ type crystal structure.

The superconductive transition temperature of the specimen was examined by electrical resistance measurement, and as a result, it was found that the present specimen causes superconductive transition at 35° K. to lower electrical resistance, and the condition of electric resistance completely disappearing begins at less than 25° K.

Figure 1:
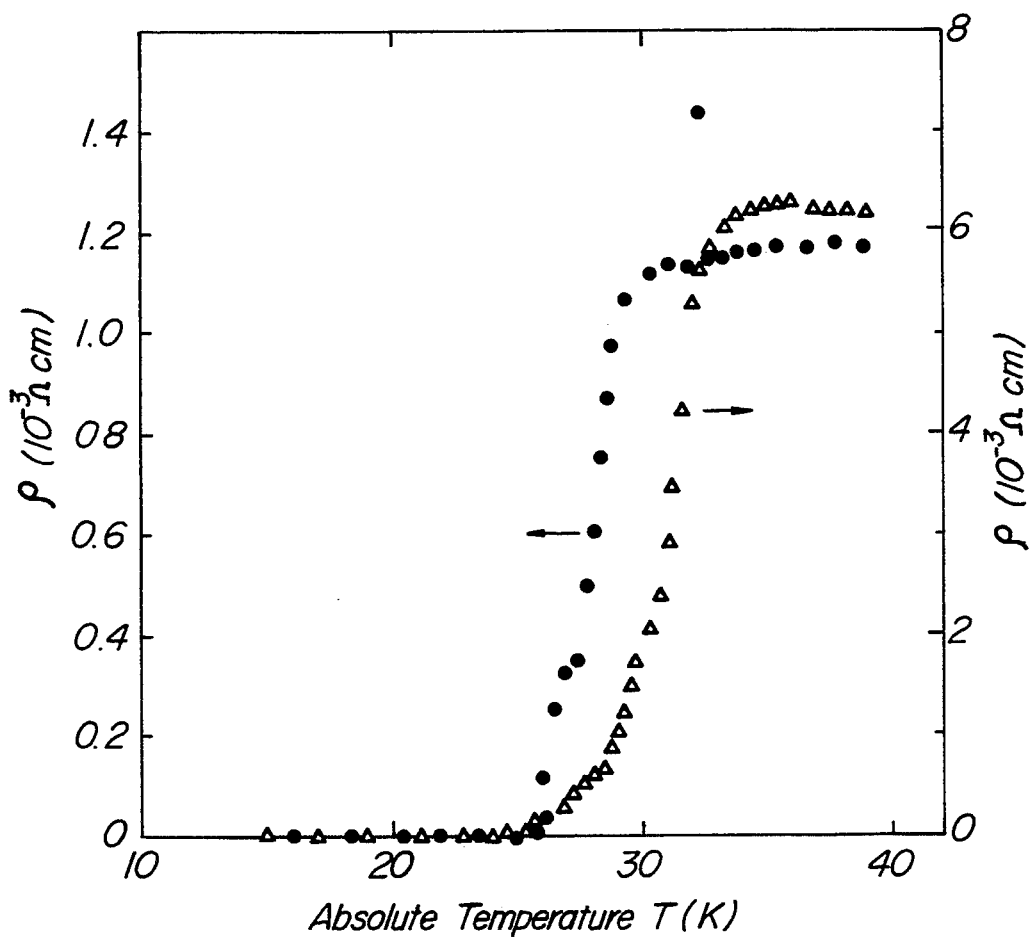
FIG. 1 is a drawing showing the temperature change characteristic of electrical resistivity of $(La_{0.925}Ba_{0.075})_2CuO_4$.

FIG. 1 is a graph showing the result after the temperature change of resistivity of the specimen $(La_{0.925}Ba_{0.075})_2CuO_4$ according to the invention. The abscissa shows an absolute temperature T (°K.) and the ordinate shows an electrical resistivity $\rho(10^{-3} \Omega.cm)$. In FIG. 1, "." show the use platinum for electrode, and "Δ" show the use gold therefor. It is confirmed from FIG. 1 that the data of "Δ" shows that the superconductive transition starting temperature is 35° K. and the electrical resistance become zero at the absolute temperature of 25° K., and the present specimen is a superconductor.

EXAMPLE 2

The calculated amounts of each powder of special grade reagent of $La_2(CO_3)_2$, $BaCO_3$ and $CuO$ were prepared a lanthanum-barium-copper-oxygen composition which X is 0.05 and 0.15 in the above formula by the same method as in Example 1. The composition was fired in the same manner as in Example 1.

It was confirmed by X-ray diffraction that each sintered material has a $K_2NiF_4$ type crystal structure.

The superconductivity transition starting temperature $T_c$ and the transition temperature width $\Delta T_c$ of each sintered material were measured and the result is shown in Table 1.

TABLE 1

| X | Superconductivity transition starting temperature $T_c$ | Transition temperature width $\Delta T_c$ |
| --- | --- | --- |
| 0.05 | 17° K. | 4° K. |
| 0.15 | 20° K. | 5° K. |

The superconductive material according to the present invention has the following advantages. (1) Because the superconductive material according to the present invention has a high critical temperature, cooling is far easier than the prior material. (2) For the above reason, the superconductive material according to the present invention can widely be applied to large-sized electronic apparatuses. (3) Even when the material is heated at a high temperature of about 1,100° C. in the air, the material is stable and freely usable in the manufacture of superconductive wire and electronics elements to a great extent. (4) Since the superconductive material according to the present invention is of a ceramics superconductor, its electric, magnetic and mechanical properties are considered to be different from those of the prior metallic superconductors, and as a result, when it is applied as Josephson elements and superconductive quantum interference elements, these properties are flexibly increased. (5) This material can be used under cooling at the temperature of the boiling point: 20.3° K. of liquid hydrogen.

EXPERIMENT I

The inventors conducted the following experiment to prove the occurrence of high $T_c$ superconductivity in the oxide composed of La, Ba and Cu cations from measurements of magnetic susceptibility.

The measurements were made using a SQUID (superconducting quantum interference device) magnetometer (SHE, model 805) on polycrystalline powder specimens at low magnetic fields below 10 Oe to investigate the Meissner effect associated with superconductivity. The temperatures were calibrated using standard superconductors Pb, Nb and Nb$_3$Sn.

The starting materials were prepared by two methods: one was a mixing of $La_2O_3$, $BaCO_3$ and $CuO$ and the other a coprecipitation from solutions of La-, Ba- and Cu-acetates with oxalic acid in appropriate cation ratios, La:Ba:Cu=(1-x):x:1, in both cases. The starting material with the composition of x=0.15 was reacted at 900° C. in air. The analysis of X-ray powder diffraction indicated mainly perovskite structure, probably based on (LaBa)CuO$_3$, mixed with layer-type perovskite, possibly (LaBa)$_2$CuO$_4$, and a small amount of other unidentified phases.

The sintered powder was then reduced for 30 minutes at 900° C. in an Ar-O$_2$ atmosphere. As compared with the initial powder, the amount of the perovskite phase was considerably reduced relative to the layer-type phase, but the annealed sample is still a mixture of these dominant phases.

Figure 2:
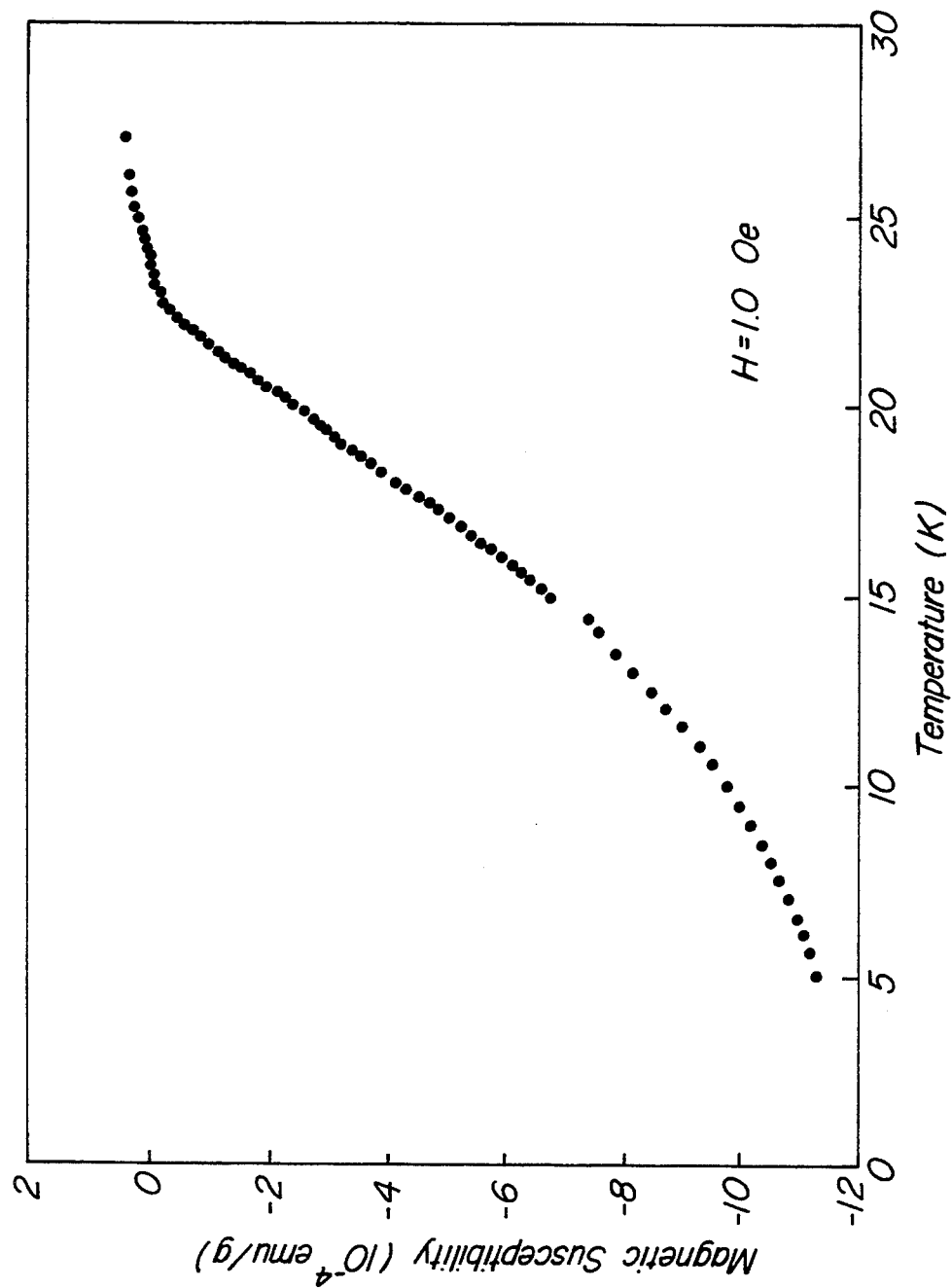
FIGS. 2 and 3 are drawings showing the temperature characteristic of magnetic susceptibility of $(La.Ba)CuO_3$ mixed with $(La.Ba)_2CuO_4$.
Figure 3:
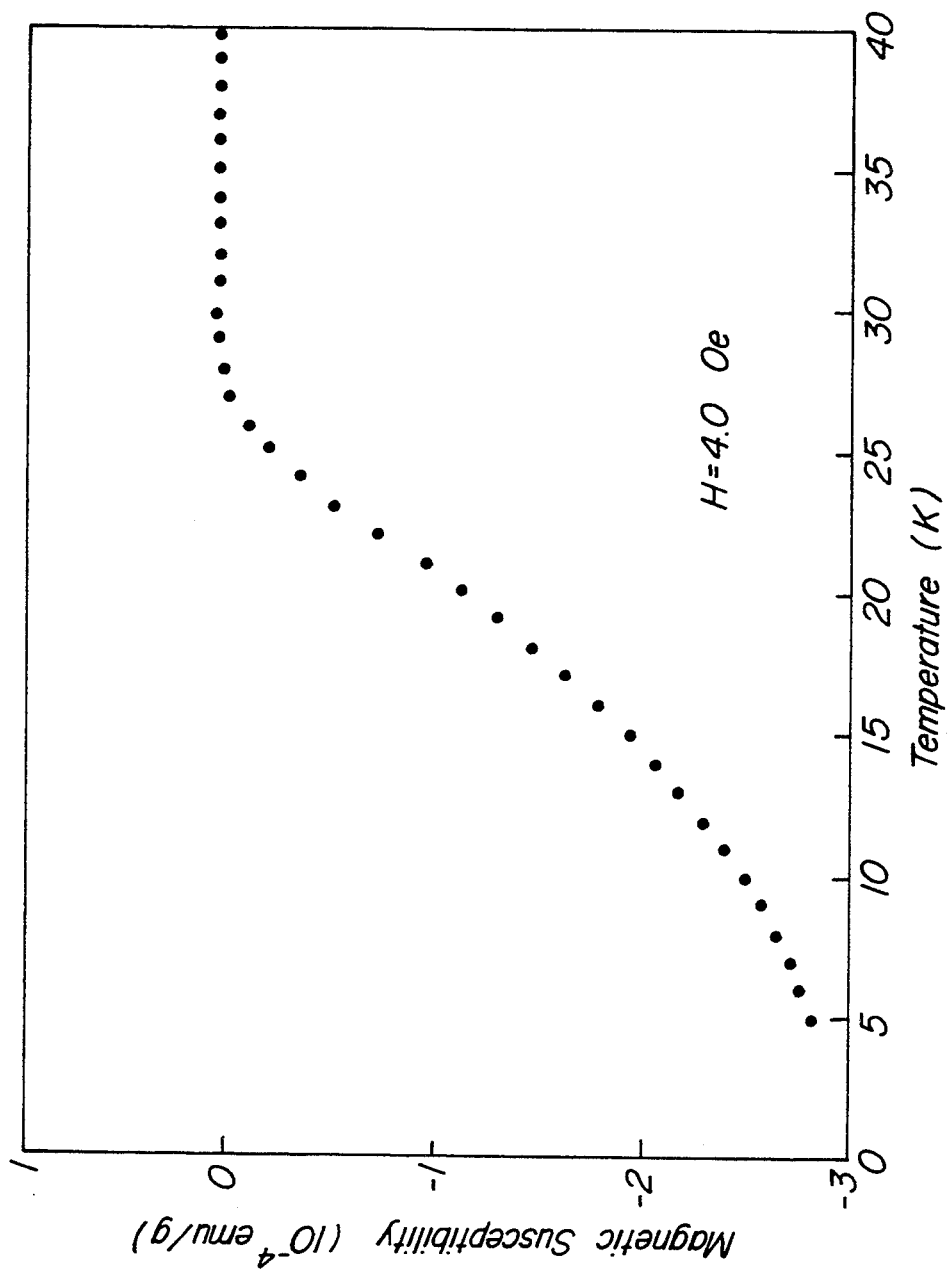

Temperature dependences of the susceptibility on typical samples are shown in FIGS. 2 and 3 a large magnetic susceptibility of more than $(-3$ to $-10) \times 10^{-4}$ emu/g was observed in both samples. The diamagnetic response increases with decreasing temperature, still increasing even at 5° K. The magnitude of diamagnetic susceptibility corresponds to about 10% of the perfect diamagnetism $(X=-\frac{1}{4}\pi)$ for the sample shown in FIG. 2. Therefore, about 10% of the total volume of the sample is considered to be in the superconducting state at 5° K. This indicates that the observed superconductivity is probably bulk in nature, although the superconducting state is not formed over the whole specimen.

For the sample shown in FIG. 3, the onset of superconductivity is observed at still higher temperatures. Even at 29 K the diamagnetic susceptibility is significantly larger than ordinary diamagnetic contributions, such as a core diamagnetism or a Landau-Peierls diamagnetism. The result is reproducible, exhibiting exactly the same magnetic response after several heat-cycles.

The broad transition observed is probably due to nonhomogeneity of the sample, as frequently observed in other oxide superconductors. Thus the result of the magnetic susceptibility indicates that a high-$T_c$ superconducting state is certainly realized in a part of the sample. Efforts are under way to identify the superconducting phase and to synthesize the material composed of a single phase, as well as to investigate the dependences of $T_c$ on various parameters, Ba composition, oxygen deficiency and annealing conditions.

EXPERIMENT II

In the preceding Experiment I, we observed high-$T_c$ superconductivity with $T_c$ near 30° K. in the La-Ba-Cu oxides. This material was suggested by Bednorz and Müller to be a high $T_c$ superconductor as a result of their resistivity measurement. In both cases, the starting material was prepared to have a composition (La.Ba)-$CuO_3$ and the products were annealed in low oxygen pressure. The samples were apparently composed of more than two phases; dominantly the perovskite and the layer-pervoskite like ($K_2NiF_4$-type) phase and the annealing of "as-prepared" powders in the cation ratios (La.Ba):Cu=1:1 in a reduced atmosphere results in a remarkable increase in the fraction of the $K_2NiF_4$-type phase. The superconducting phase, however, has not yet been specified.

In this Experiment II, the inventors conducted the following experiment to present evidence that the $K_2NiF_4$-type phase $(La.Ba)_2CuO_{4-y}$ is responsible for the high-$T_c$ superconductivity. We prepared the samples in the cation ratios (La.Ba):Cu=2:1 which were annealed at various oxygen pressures. The volume fraction of the superconducting phase was estimated by measuring the diamagnetic susceptibility. It was found that the increase in the fraction of $K_2NiF_4$-type phase estimated from X-ray analysis corresponded to the increase in the volume fraction of the superconducting phase. This suggests that the high-$T_c$ superconductivity may be realized in the $K_2NiF_4$-type phase, probably $(La.Ba)_2CuO_{4-y}$.

Figure 4:
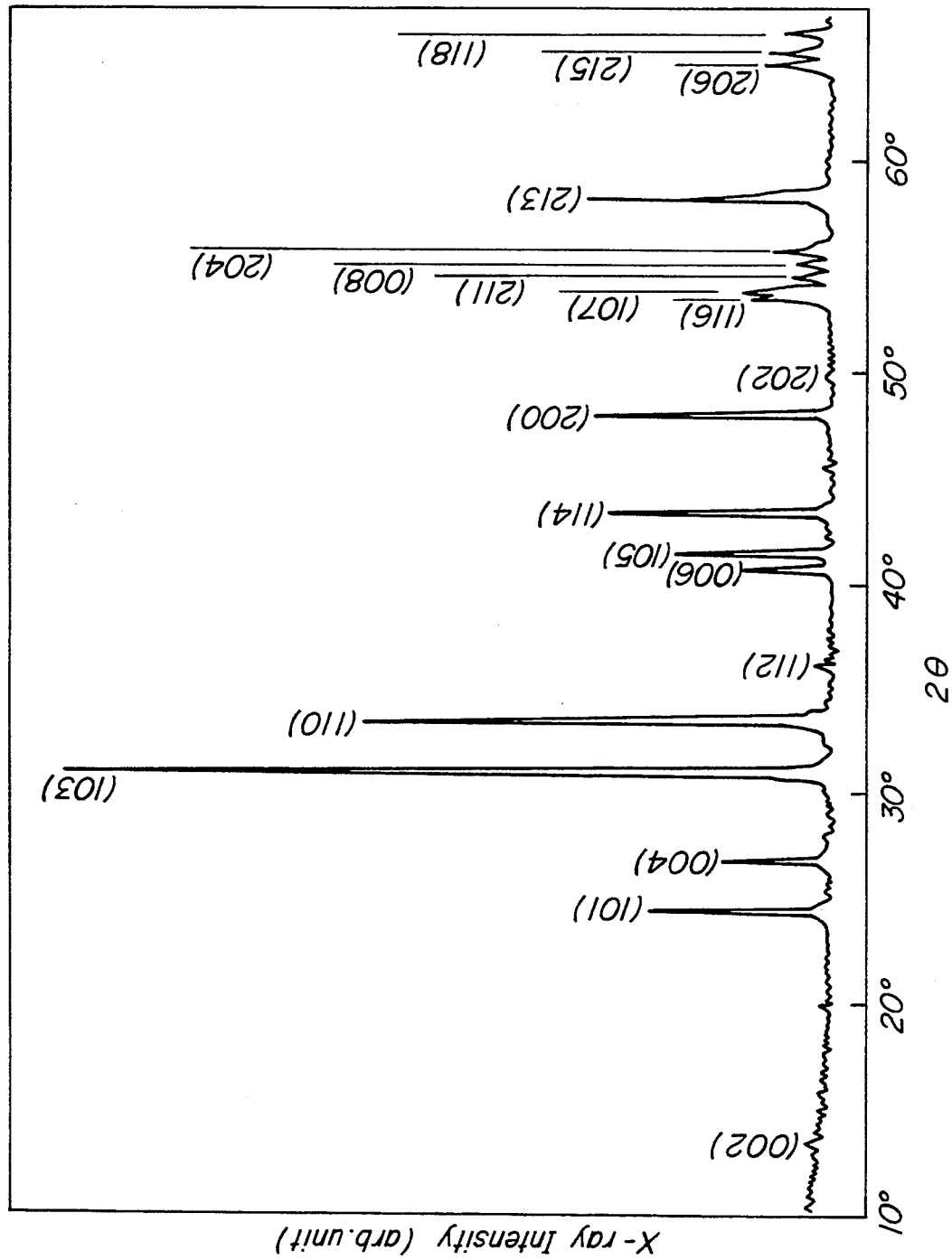
FIG. 4 is a drawing showing the X-ray powder diffraction pattern of a single phase $(La.Ba)_2CuO_{4-y}$.

In order to confirm the occurrence of superconductivity in the $K_2NiF_4$-type phase, the inventors have synthesized a single phase $(La.Ba)_2CuO_{4-y}$. The powdered specimen was prepared by reacting the mixture of $La_2O_3$, $BaCO_3$ and CuO in cation ratios La:Ba:Cu=2(1-x):2x:1 (x=0, 0.05, 0,075, 0.10 and 0.15) at 1,100° C. in air for 24 hours. The X-ray powder diffraction pattern of the prepared sample is shown in FIG. 4, which indicates that almost a single phase with $K_2NiF_4$-type structure is synthesized. No trace of the perovskite phase nor any other phase is observed.

Figure 5:
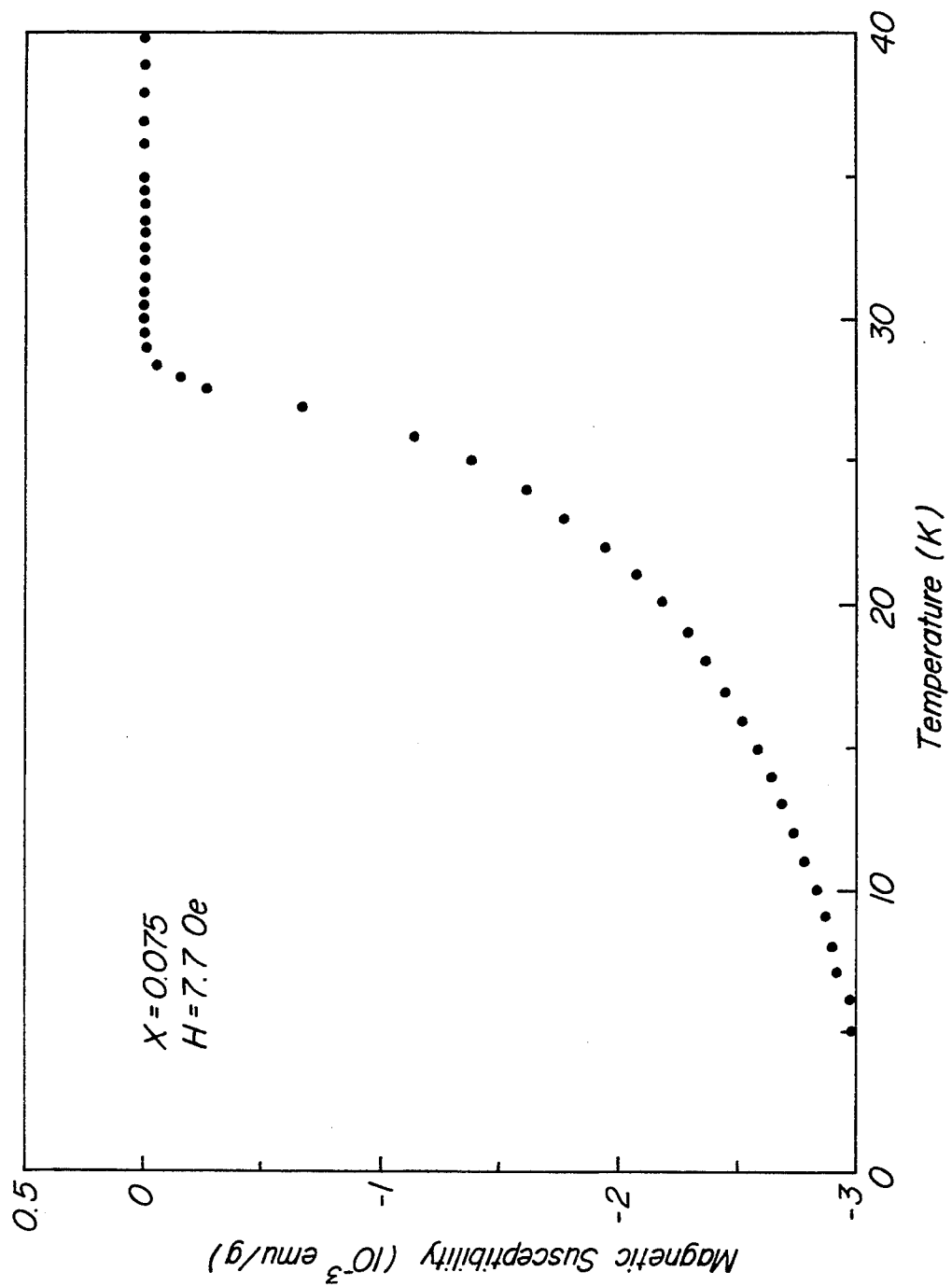
FIG. 5 is a drawing showing the temperature change characteristic of magnetic susceptibility of a single phase $(La.Ba)_2CuO_{4-y}$.

The result of the magnetic susceptibility measurement on the $K_2NiF_4$-type single phase with x=0.075 is shown in FIG. 5. A rather steep superconducting transition as compared with the previous result is seen at around 29° K. About 30% of the total volume is estimated to be in the superconducting state at 5° K., that is much larger than the previous result. Superconductivity was observed also for the samples with x=0.05, 0.10 and 0.15 but not for x=0. The effect of the annealing in the reduced atmosphere was examined, and it was found that the annealing results in the disappearance of superconductivity.

Figure 6:
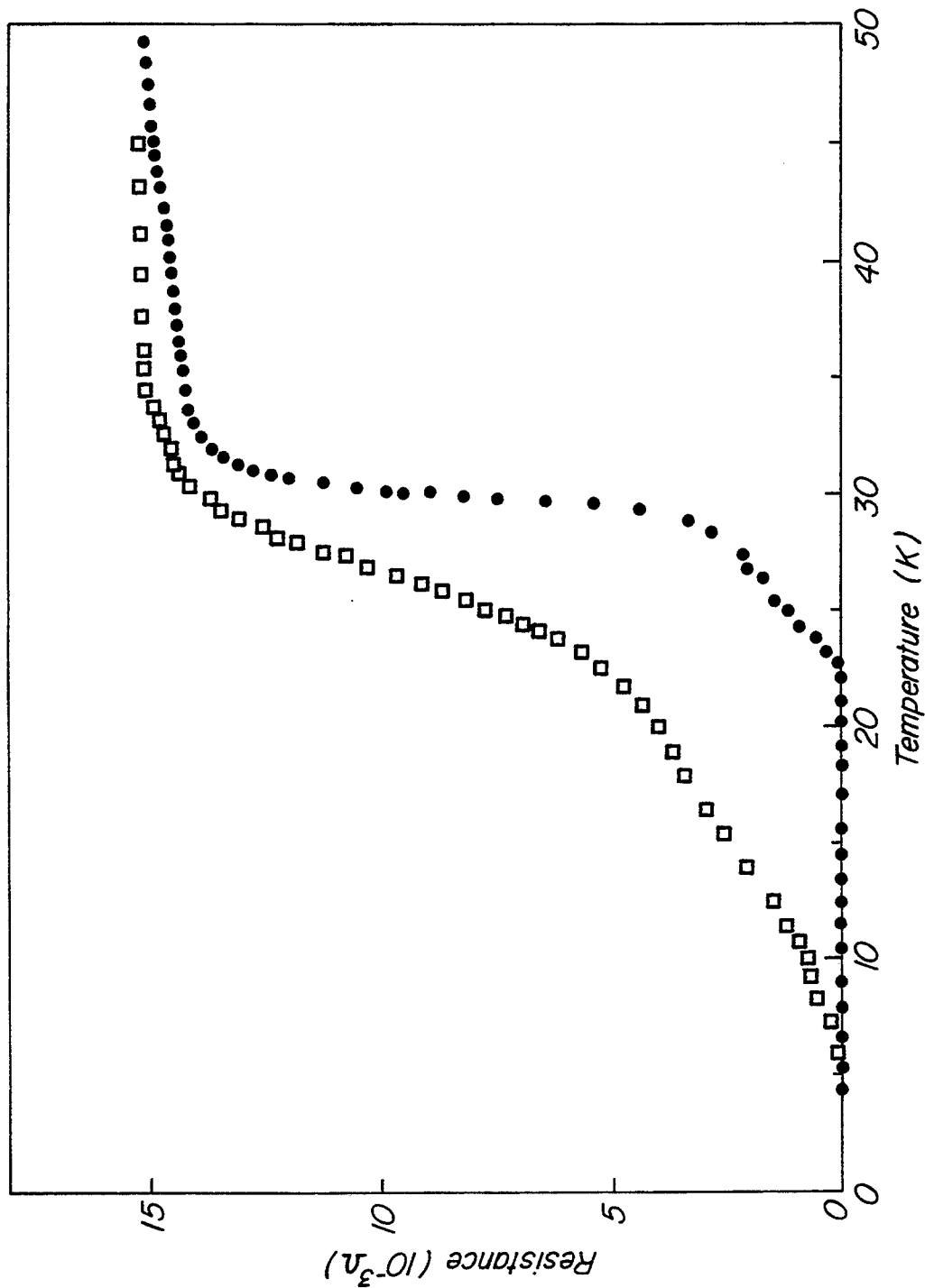
FIG. 6 is a drawing showing the temperature change characteristic of resistance of a single phase $(La.Ba)_2CuO_{4-y}$.

Inventors have also made a resistivity measurement on the sintered pellet of the powder with x=0.075 as shown in FIG. 6. The measurement was made by the usual four-probe method with gold-evaporated electrodes. The resistivity gradually decreases with lowering temperature and then drops abruptly at around 32° K. The resistivity below 22° K. is smaller than the limit of our instrumental resolution. Combined with the magnetic susceptibility data, it can be said that the sample is actually superconducting.

We conclude from these results that high-$T_c$ superconductivity is realized in the $K_2NiF_4$-type phase, $(La.Ba)_2CuO_{4-y}$. In this structure, the substitution of La with Ba will lead to the Cu-mixed-valence state, $Cu^{2+}$-$Cu^{3+}$. On the other hand, the reduction of the oxidation degree will bring $Cu^{3+}$ back to $Cu^{2+}$, destroying the mixed-valence state. Thus, the mixed-valence seems to play an important role in the present high-$T_c$ superconductor as in the case of $LiTi_2O_4$ and $BaPb_{1-x}Bi_xO_3$ which is known in the prior art.

The broad transition and the incomplete Meissner effect are probably due to the inhomogeneity in the sample, such as the fluctuation of the La/Ba composition or the oxygen deficiency. We concluded in Experiment II that attempts should be continued to improve the homogeneity as well as to obtain single crystals.

EXPERIMENT III

We have succeeded in synthesizing material of a single $K_2NiF_4$-type phase which exhibited a sharp superconducting transition near 30° K. in both susceptibility and resistivity measurement. Notably the resistivity was substantially zero below 22° K.

Here we report the result of resistivity measurements in details. The dc resistivity measurements were performed on hot-pressed specimens of $(La_{1-x}Ba_x)_2CuO_4$ in the usual four-probe method. The starting material was prepared in the same procedure as described in the preceding Experiment II. A sintered pellet was hot pressed at 1,000° C. under a pressure of 300 kbar for 3 hours. The specimens used for the resistivity measurements were cut into rectangular shape, typically $1\times2\times10$ mm$^3$. The electrodes were attached on these specimens in two different ways; evaporation of gold films or application of platinum paste followed by heat treatment at 1,100° C. in $O_2$ atmosphere.

Figure 7:
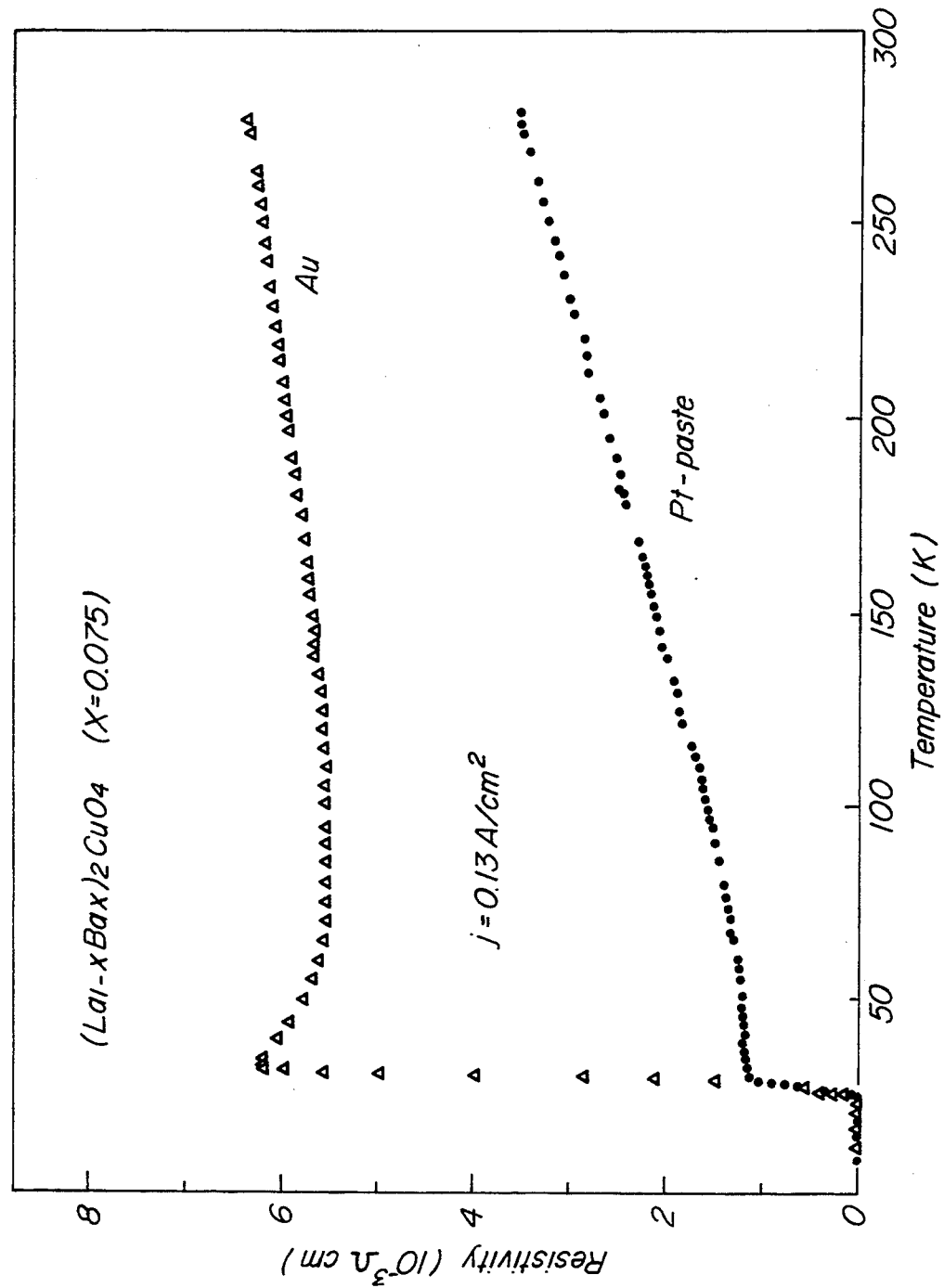
FIG. 7 is a drawing showing the temperature change characteristic of resistivity of $(La_{1-x}Ba_x)_2CuO_4$.

FIG. 7 shows the temperature dependence of two samples cut from the same hot-pressed ingot with Ba composition x=0.075 but with different electrodes. Temperature was monitored by a calibrated germanium thermometer (Lake Shore Model No. GR-200A-1000) as well as by an Au(Fe)-Ag thermocouple. They were attached in the close vicinity of the samples. The temperature was stabilized by making a balance between heating power and the pressure of helium exchange gas.

As is seen more clearly in FIG. 1, both samples exhibit a sharp drop in the resistivity around 30° K., the onset of the drop being at temperature as high as 35° K. for the sample with Au electrodes. These data were taken with current density j=0.13 A/cm$^2$. The resistivity was found to be sensitive to the current density in the temperature range between the onset and 20° K. This is due either to the percolative conduction in the granular specimens or to the Joule-heating at the contacts with the electrodes where the contact resistance was as high as 20 Ω in the case of Au electrodes. The low-T tail of the superconducting transition seen in both samples might arise from such effects. Nevertheless, the "zero-resistance" state was observed, within our instrumental resolution, below 25° K. in both samples with the above current density. This temperature already exceeds the highest onset $T_c$ in Nb$_3$Ge (23.7° K.).

The normal-state resistivity is higher, by a factor of about 4 at 50° K., for the sample with gold electrodes than for the one with Pt-paste electrodes, showing a gradual increase below 90° K. Such increase was also observed more dominantly in the samples of Bednorz and Müller and in our samples in the earlier stage. At present it is not clear whether this arises from the disorder-effect, i.e. the effect of inhomogeneity in the sample, such as the presence of secondary phases or resistive barriers on the surface of each grain. It cannot be ruled out either that it is intrinsic in origin, since the relevant electronic states in this material might be strongly localized Cu-3d-derived orbitals.

The sample with Pt electrodes, on the other hand, does not show a low-T increase in resistivity. Certainly the heat-treatment on attaching Pt-paste electrodes affected the property of the sample. In this case the normal-state resistivity increases almost linearly, like usual metals, as the temperature is raised. The residual resistivity ratio is about 3, as defined by R(300K)/R(40K). The T-linear term is also seen in the sample with Au electrodes where it seems to compete with the low-T resistivity rise, giving rise to a minimum at around 90° K. The presence of an obvious T-linear term is in contrast to the case of BaPb$_{1-x}$Bi$_x$O$_3$. In the latter material the resistivity is either almost T-independent or decreasing with increase of T over a wide temperature region, so that the mean free path of the conduction electrons is estimated to be of the order of lattice spacing. Therefore, it is estimated that the mean free path of La-Ba-Cu oxide might be longer as compared with that in BaPb$_{1-x}$Bi$_x$O$_3$.

Figure 8:
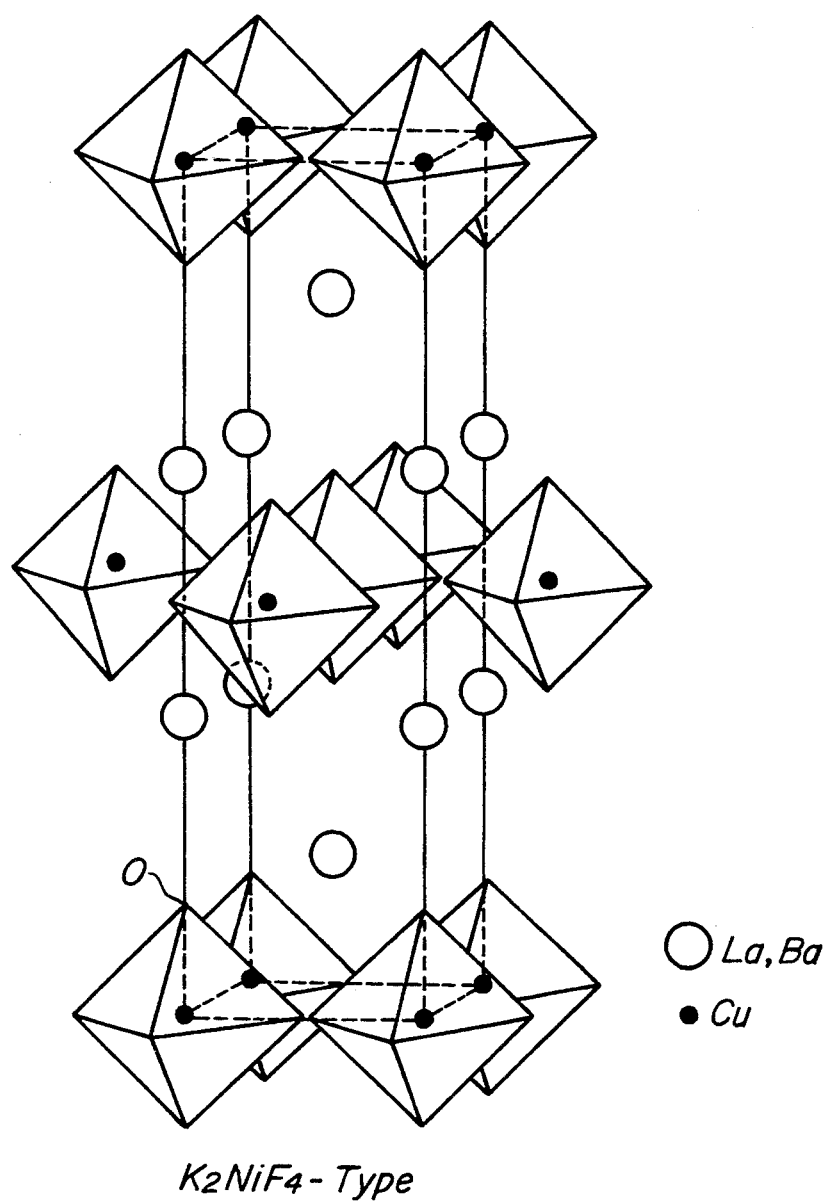
FIG. 8 is a drawing showing a structure of crystalline $K_2NiF_4$ type structure in $(La_{1-x}Ba_x)_2CuO_4$.

So far none of the oxide materials with K$_2$NiF$_4$-type structure have not shown a truly metallic behavior over a wide temperature range. La$_2$CuO$_4$ was once considered to be metallic. However, the recent result indicates a semiconducting T-dependence of the resistivity below 300° K. Thus, as far as we know, (La$_{1-x}$Ba$_x$)$_2$CuO$_4$ is the first truly metallic material with K$_2$NiF$_4$-type structure as shown in FIG. 8.

We are now interested in the effects of magnetic field on the superconductivity of the present hight-$T_c$ material. It was already confirmed by the magnetic susceptibility measurements that this material is a type II-superconductor, the magnetization varying linearly with field and showing a maximum at around 100 Oe at 4.5° K. As a preliminary work, we have measured resistivity by applying a field up to 60 kOe. The superconducting state was not destroyed even at 60 kOe for the temperatures lower than 10° K. Measurements of the critical field using high magnetic field of 400 kOe are now under way.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method of transmitting electrical current in a superconducting manner, comprising:
   (a) preparing a superconductive material consisting essentially of a composition having the formula $$(La_{1-x}M_x)_2CuO_{4-x/2}$$

wherein M=Ba and $0.04 \leq x < 0.075$, as a main body, wherein the material has a K$_2$NiF$_4$ crystal structure and has a zero resistance temperature higher than the boiling point of liquid hydrogen;
   (b) cooling said material such that it becomes superconducting; and
   (c) passing said electrical current through said material.

2. A method of transmitting electrical current in a superconducting manner as defined in claim 1, wherein the superconductive material has an onset temperature of about 30° K.

3. A method of claim 1 wherein the magnetic susceptibility is more than about $(-3 \text{ to } -10) \times 10^{-4}$ emu/g.

4. A method as claimed in claim 1, wherein $0.04 \leq x \leq 0.05$.

5. A method as claimed in claim 1, wherein the material is heat treated at a temperature of at least 1000° C.

6. A method as claimed in claim 1, wherein the material is heat treated at a temperature of from 1000° C. to 1100° C.

* * * * *